(12) United States Patent
Shigihara et al.

(10) Patent No.: US 7,215,694 B2
(45) Date of Patent: May 8, 2007

(54) SEMICONDUCTOR LASER DEVICE

(75) Inventors: Kimio Shigihara, Tokyo (JP);
Kazushige Kawasaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 371 days.

(21) Appl. No.: 10/866,696

(22) Filed: Jun. 15, 2004

(65) Prior Publication Data

US 2005/0047464 A1 Mar. 3, 2005

(30) Foreign Application Priority Data

Aug. 27, 2003 (JP) ............................. 2003-303368

(51) Int. Cl.
*H01S 5/00* (2006.01)
(52) U.S. Cl. .............................. 372/49.01; 372/43.01; 372/46.01
(58) Field of Classification Search ............ 272/49.01; 372/43.01, 45.01, 49.01
See application file for complete search history.

(56) References Cited

U.S. PATENT DOCUMENTS

| | | | | | |
|---|---|---|---|---|---|
| 4,656,638 | A | * | 4/1987 | Tihanyi et al. | 372/49.01 |
| 4,951,291 | A | * | 8/1990 | Miyauchi et al. | 372/49.01 |
| 4,975,922 | A | * | 12/1990 | Sakane et al. | 372/49.01 |
| 5,282,219 | A | * | 1/1994 | Shigihara et al. | 372/49.01 |
| 5,285,468 | A | * | 2/1994 | Ackerman et al. | 372/96 |
| 5,960,021 | A | * | 9/1999 | De Vrieze et al. | 372/49.01 |
| 6,067,310 | A | * | 5/2000 | Hashimoto et al. | 372/49.01 |
| 6,487,227 | B1 | * | 11/2002 | Kuramachi | 372/49.01 |
| 6,677,618 | B1 | * | 1/2004 | Horie et al. | 257/94 |
| 6,798,811 | B1 | * | 9/2004 | Sugahara et al. | 372/49.01 |
| 7,039,085 | B2 | * | 5/2006 | Kunitsugu et al. | 372/49.01 |
| 7,065,117 | B2 | * | 6/2006 | Yamanaka | 372/49.01 |
| 7,065,118 | B2 | * | 6/2006 | Tojo et al. | 372/49.01 |
| 2002/0064200 | A1 | * | 5/2002 | Oshima et al. | 372/49 |

(Continued)

FOREIGN PATENT DOCUMENTS

JP 9-129979 5/1997

OTHER PUBLICATIONS

T. Ohtoshi, et al., J. Appl. Phys. vol. 56, No. 9, pp. 2491-2496, "High-Power Visible GaAlAs Lasers with Self-Aligned Strip Buried Heterostructure", Nov. 1, 1984.

(Continued)

*Primary Examiner*—Minsun Oh Harvey
*Assistant Examiner*—Phillip Nguyen
(74) *Attorney, Agent, or Firm*—Oblon, Spivak, McClelland, Maier & Neustadt, P.C.

(57) ABSTRACT

A semiconductor laser device comprises an active layer, a cladding layer, an end face for emitting light. A low-reflective film is provided on the end face. The reflectance of the low-reflective film changes with wavelength. A wavelength at which the reference of the low-reflective film is minimized is on the long wavelength side of a wavelength at which the gain of the semiconductor laser device is maximized. The gain and the loss of the semiconductor laser device become equal at a wavelength only in a wavelength region in which the reflectance of the low-reflective film decreases with increasing wavelength. The reflectance of the low-reflective film is preferably set to 1% or less at the wavelength at which the gain of the semiconductor laser device is maximized.

15 Claims, 13 Drawing Sheets

U.S. PATENT DOCUMENTS

2002/0141467 A1* 10/2002 Iwai et al. .................. 372/45
2003/0168667 A1   9/2003 Shigihara et al.
2003/0210722 A1* 11/2003 Arakida et al. ............... 372/49
2006/0133441 A1*  6/2006 Arakida et al. ........... 372/49.01

OTHER PUBLICATIONS

H. Yonezu, Kougakutosho co. edition, pp. 242-255, "Optical Communication Engineering Light-Emitting/Light Receiving Devices-" (with English translation of table 4.2).

* cited by examiner

Wavelength (nm)

US 7,215,694 B2

SEMICONDUCTOR LASER DEVICE

BACKGROUND OF THE INVENTION

1. Field of the Invention

The present invention relates to a semiconductor laser device used as a light source for optical information processing, a signal source for optical communications, or an excitation light source for fiber amplifiers.

2. Background Art

FIG. 13 shows the relationship between the wavelength and the optical output power of a conventional semiconductor laser device. The semiconductor laser device of FIG. 13 is constructed such that an $SiO_2$ film is provided on the front end face (emitting end face) and a multilayer film made up of $SiO_2$ films and amorphous silicon films is provided on the rear end face. In this case, the reflectance of the front end face is 6% while that of the rear end face is 94% (see, for example, "High-power visible GaAlAs lasers with self-aligned stripe buried heterostructure", by T. Ohtoshi et al., Journal of Applied Physics (US), 1984, vol. 56, No. 9, pp. 2491–2496).

Referring to FIG. 13, as the optical output power changes from 1 mW to 30 mW, the emission wavelength changes from 780 nm to 786 nm. That is, the change in the wavelength per unit output power is 0.21 nm/mW. Therefore, the change in the wavelength per unit current is 0.21 nm/mA, assuming that the slope efficiency is 1 mW/mA.

Such a change in the wavelength is attributed to an increase in the temperature of the active layer due to an increase in the injection current. It is reported that the change in the wavelength per unit temperature is approximately 0.2–0.3 nm/° C. for AlGaAs semiconductor lasers and approximately 0.4–0.7 nm/° C. for InGaAsP semiconductor lasers (see, for example, "Optical Communications Device Engineering", third edition, by Hiroo Yonezu, Kougakutosho Ltd., 1986, pp. 243–255).

The above conventional semiconductor laser device has a structure in which only an $SiO_2$ film having a thickness of $\lambda/4$ is provided on the front end face (where $\lambda$ is the wavelength). Therefore, the reflectance of the front end face is as high as 6%; the conventional semiconductor laser device cannot achieve low reflectance (1% or less).

Furthermore, the conventional semiconductor laser device exhibits a large change in the emission wavelength due to the temperature dependence of its gain, which causes a significant problem when it is used for applications requiring a stable-wavelength light source.

SUMMARY OF THE INVENTION

The present invention has been devised in view of the above problems. It is, therefore, an object of the present invention to provide a semiconductor laser device having a low-reflectance front end face and exhibiting only a small change in the emission wavelength with temperature.

According to one aspect of the present invention, a semiconductor laser device comprises an active layer, a cladding layer, and an end face for emitting light. A low-reflective film is provided on the end face. The reflectance of the low-reflective film changes with wavelength. A wavelength at which the reflectance of the low-reflective film is minimized is on the long wavelength side of a wavelength at which the gain of the semiconductor laser device is maximized. The gain and the loss of the semiconductor laser device become equal at a wavelength only in a wavelength region in which the reflectance of the low-reflective film decreases with increasing wavelength.

Other and further objects, features and advantages of the invention will appear more fully from the following description.

DETAILED DESCRIPTION OF THE PREFERRED EMBODIMENTS

Figure 1:
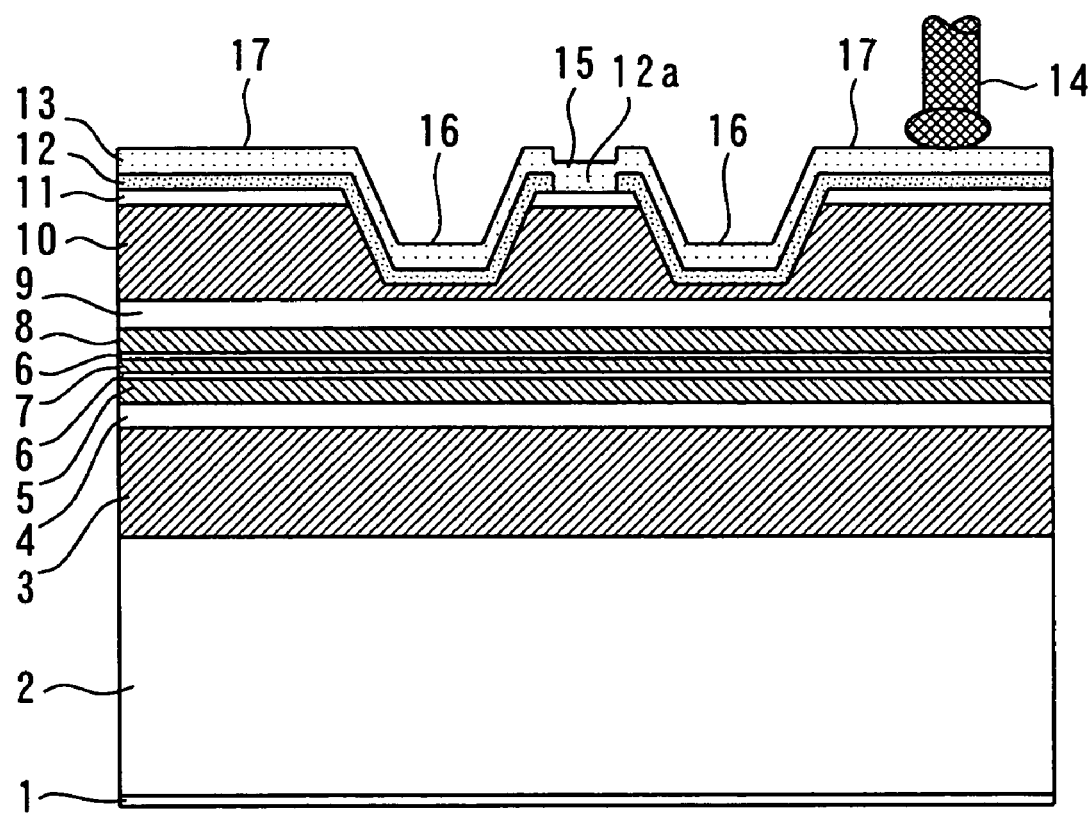
FIG. 1 is a cross-sectional view of a semiconductor laser device according to the present invention.

FIG. 1 shows a cross-sectional view of a semiconductor laser device according to an embodiment of the present invention. Referring to FIG. 1, reference numeral 1 denotes an n-side electrode; 2, an n-side GaAs substrate; 3, an n-side AlGaAs cladding layer; 4, an undoped n-side AlGaAs guide layer; 5, an undoped n-side GaAs guide layer; 6, an undoped InGaAs quantum well active layer; 7, an undoped GaAs barrier layer; 8, an undoped p-side GaAs guide layer; 9, an undoped p-side AlGaAs guide layer; 10, a p-side AlGaAs cladding layer; 11, a p-side GaAs capping layer; 12, an $Si_3N_4$ insulating film; 13, a p-side electrode; 14, a gold wire; 15, a ridge region; 16, low refractive index regions which sandwich the ridge region 15; and 17, high refractive index regions which sandwich the low refractive index regions 16. In the figure, the gold wire 14 is wire-bonded onto one of the high refractive index regions 17.

As shown in FIG. 1, the low refractive index regions 16 sandwich the ridge region 15 so as to efficiently confine the laser light within the ridge region 15. Furthermore, an opening 12*a* is provided in the $Si_3N_4$ insulating film 12 to confine the current.

Figure 2:
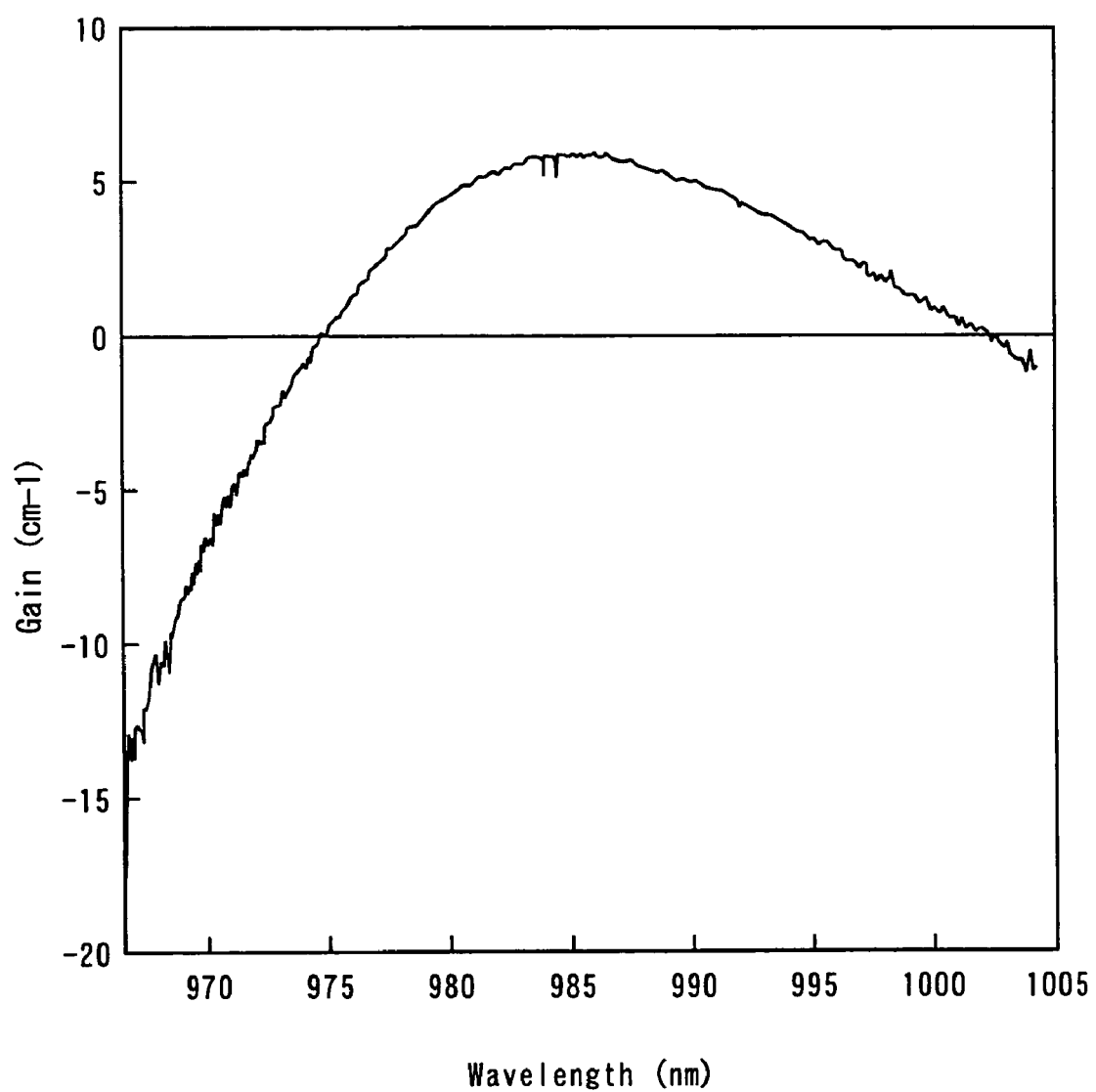
FIG. 2 shows wavelength dependence of the gain of a semiconductor laser device according to the present invention.

FIG. 2 shows wavelength dependence of the gain of a sample of the semiconductor laser device shown in FIG. 1, measured at a current 1 mA lower than the threshold current. The sample was fabricated using a crystal semiconductor slice obtained as a result of cleavage, and has a resonator length of 1,500 µm. In the example of FIG. 2, the wavelength at which the gain is maximized is approximately 984 nm. It should be noted that the reflectance of each film coated on the end faces of a semiconductor laser changes with the wavelength, and so does the mirror loss, which is calculated using these reflectance values. This specification simply uses the words "reflectance" and "mirror loss" to refer to a reflectance and a mirror loss obtained at the wavelength at which the gain is maximized, unless otherwise indicated. It should be further noted that the present embodiment is described as applied to a semiconductor laser having an emission wavelength of 980 nm used as an excitation light source for fiber amplifiers. However, it goes without saying that the present invention is not limited to this particular type of semiconductor laser.

Figure 3:
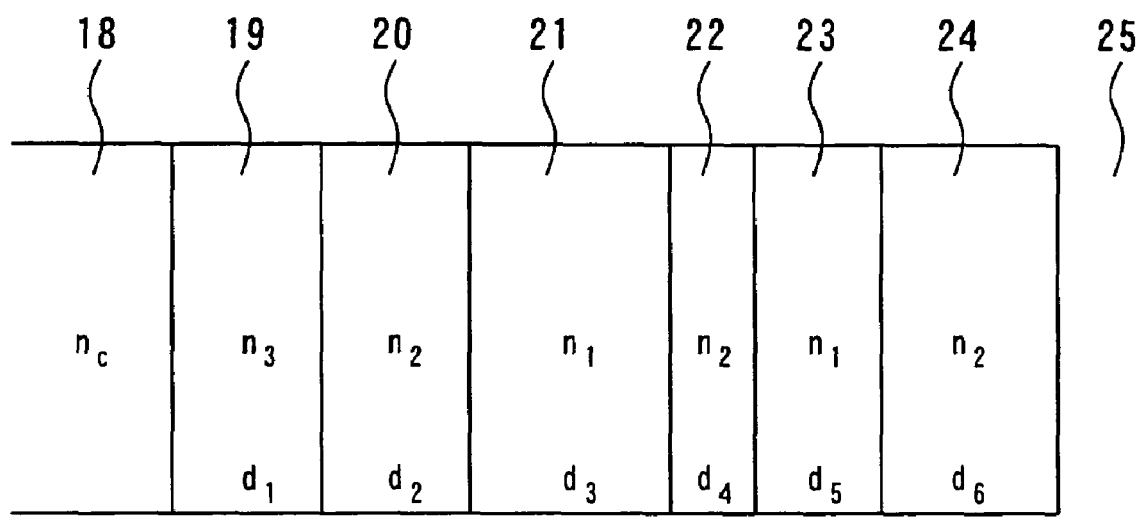
FIG. 3 shows a low-reflective film according to the present invention.

FIG. 3 shows an illustrative low-reflective film provided on the front end face (light emitting end face) of the semiconductor laser device of the present embodiment. Such a low-reflective film allows the front end face to have reflectance dependent on the wavelength.

Referring to FIG. 3, reference numeral 18 denotes a semiconductor laser device having an equivalent refractive index of nc (3.370); 19, a first-layer film of $Al_2O_3$ (alumina) having a refractive index of n3 (1.629) and a film thickness of d1 (20.0 nm); 20, a second-layer film of $SiO_2$ (quartz) having a refractive index of n2 (1.484) and a film thickness of d2 (8.28 nm); 21, a third-layer film of $Ta_2O_5$ (tantalum pentoxide) having a refractive index of n1 (2.072) and a film thickness of d3 (85.59 nm); 22, a fourth-layer film of $SiO_2$ having a refractive index of n2 (1.484) and a film thickness of d4 (183.89 nm); 23, a fifth-layer film of $Ta_2O_5$ having a refractive index of n1 (2.072) and a film thickness of d5 (85.59 nm); and 24, a sixth-layer film of $SiO_2$ having a refractive index of n2 (1.484) and a film thickness of d6 (183.89 nm). Thus, the low-reflective film is a multilayer film made up of the first-layer film 19, the second-layer film 20, the third-layer film 21, the fourth-layer film 22, the fifth-layer film 23, and the sixth-layer film 24 laminated in that order. The first-layer film 19 is disposed closest to the front end face of the semiconductor laser device 18. It should be noted that in FIG. 3, reference numeral 25 denotes exterior space having a refractive index of 1.00. The exterior space 25 is composed of air, nitrogen, or free space.

Figure 4:
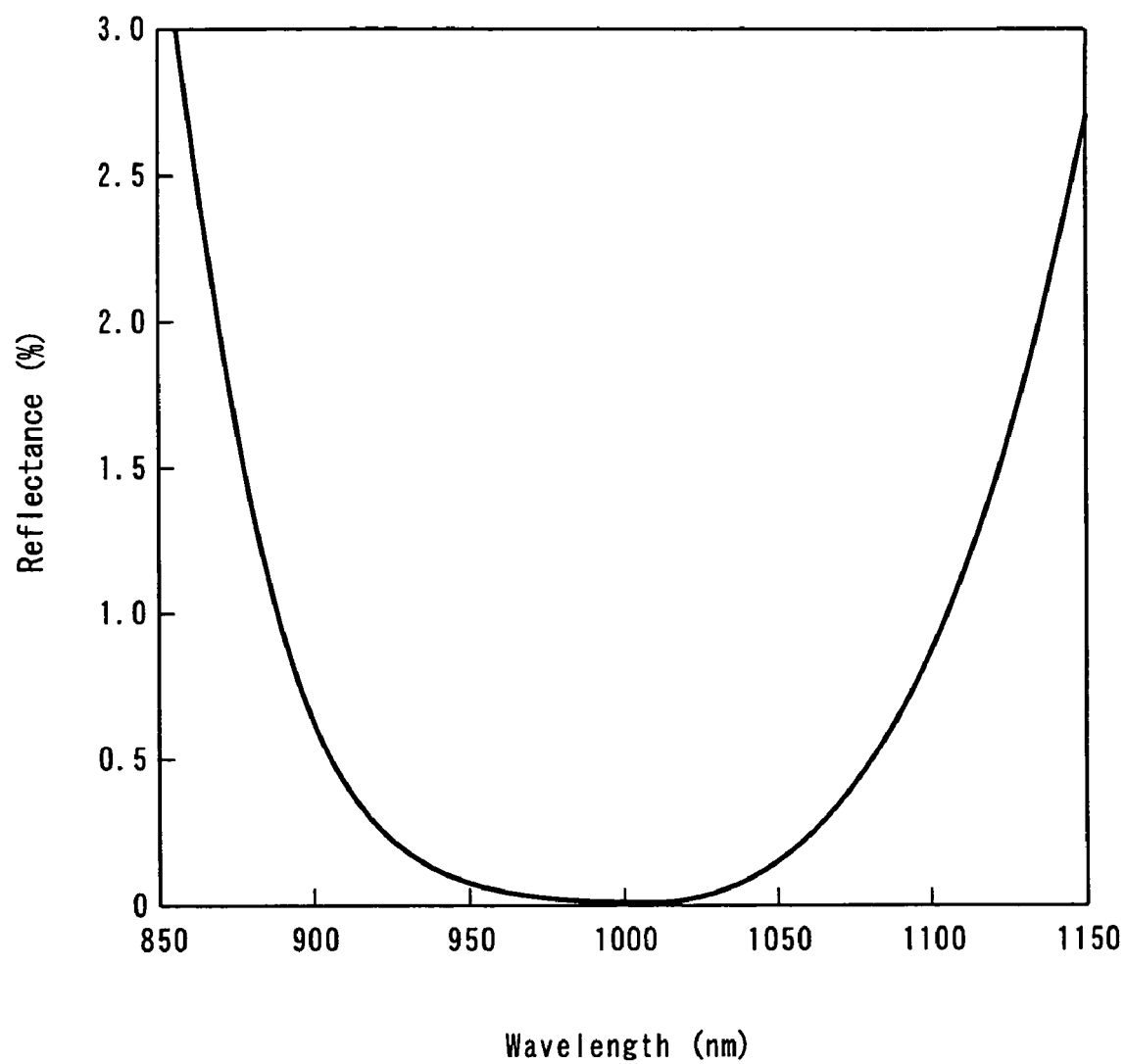
FIG. 4 shows wavelength dependence of the reflectance of the low-reflective film according to the present invention.

FIG. 4 shows a relationship between the reflectance of the low-reflective film shown in FIG. 3 and the wavelength, obtained by a calculation. As can be seen from FIG. 4, the reflectance of the low-reflective film varies with the wavelength.

Figure 5:
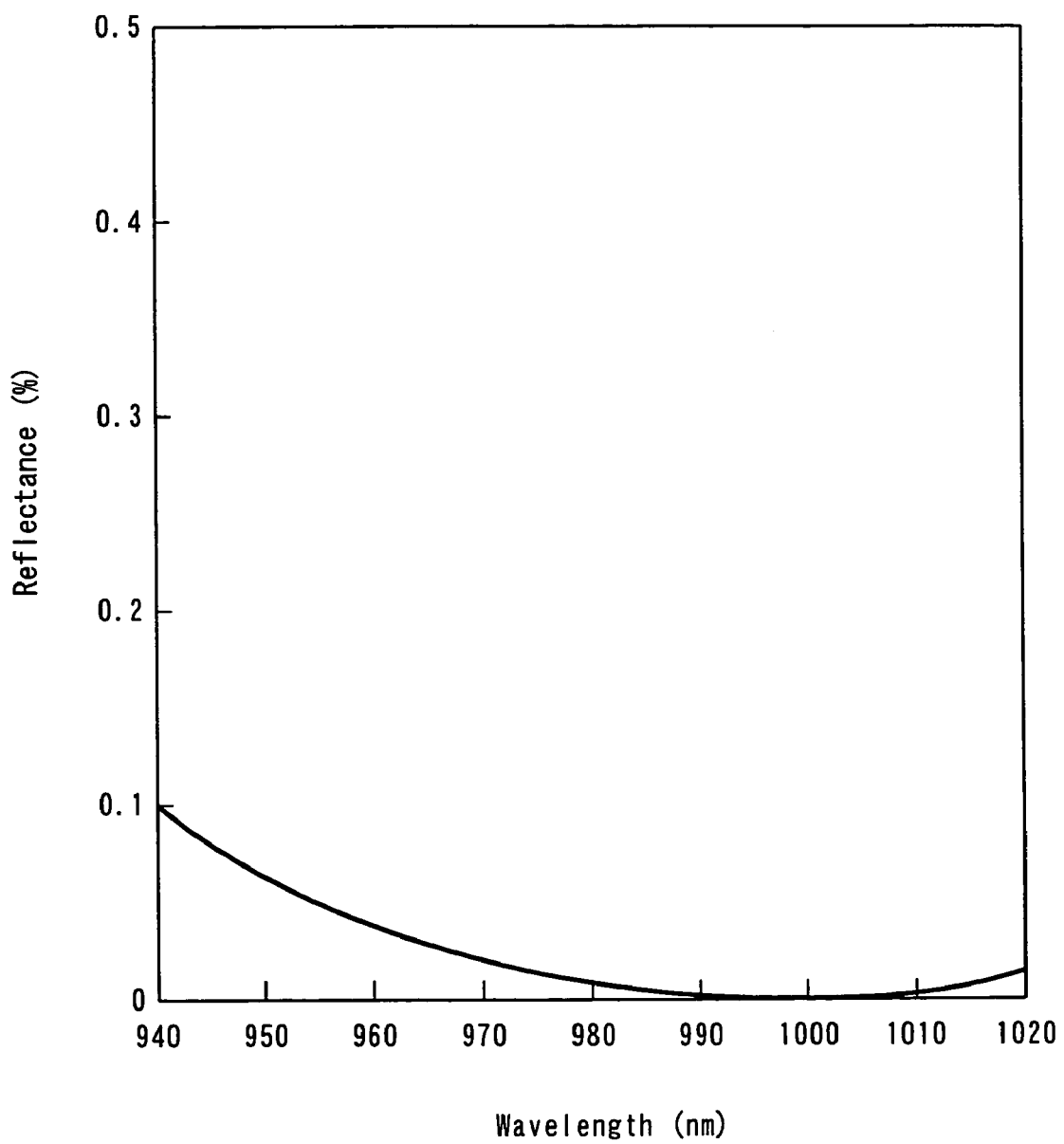
FIG. 5 shows wavelength dependence of the reflectance of the low-reflective film according to the present invention.

In FIG. 4, the minimum value of the reflectance is zero, which means that the low-reflective film has a wavelength at which no reflection occurs. It should be noted that the wavelength at which no reflection occurs can be changed by changing the wavelength at which the gain of the semiconductor laser device is maximized. Assuming, for example, that the wavelength at which the gain is maximized is 984 nm, then the wavelength at which no reflection occurs is 1,000 nm in FIG. 4. This means that in the neighborhood of the wavelength 984 nm, the reflectance decreases with increasing wavelength. FIG. 5 is an enlarged view of a portion of FIG. 4 showing the wavelength region from 940 nm to 1,020 nm. FIG. 5 clearly shows that the reflectance decreases with increasing wavelength in the neighborhood of the wavelength 984 nm.

Thus, the low-reflective film of the present embodiment is characterized in that its reflectance is minimized at a wavelength on the long wavelength side of the wavelength at which the gain of the semiconductor laser device is maximized, and the gain and the loss of the semiconductor laser device become equal and thereby oscillation occurs at a wavelength only in the wavelength region in which the reflectance of the low-reflective film decreases with increasing wavelength. This arrangement can provide a semiconductor laser device having a low-reflectance front end face and exhibiting a small change in the emission wavelength with temperature.

Further, the low-reflective film of the present embodiment preferably has a reflectance level of 1% or less at the wavelength at which the gain of the semiconductor laser device is maximized. In the example of FIG. 4, the reflectance is 1% or less at the wavelengths 889 to 1,103 nm. That is, the low-reflective film has a reflectance level of 1% or less at the wavelength 984 nm, at which the gain is maximized. The wavelength range in which the reflectance of the low-reflective film is 1% or less is wide (214 nm). Increasing this wavelength range can prevent the wavelength from rapidly changing from one value to another.

A semiconductor laser device of the present embodiment may be constructed such that the rear end face has thereon a multilayer film made up of 10 layers formed in such a way that $SiO_2$ films and amorphous silicon films are laminated alternately on an $Al_2O_3$ film (first-layer film). The film thickness of each film may be set to λ/4. In such a case, the reflectance of the rear end face is approximately 97% (at the wavelength at which the gain is maximized), and the reflectance changes little with changing wavelength.

Figure 6:
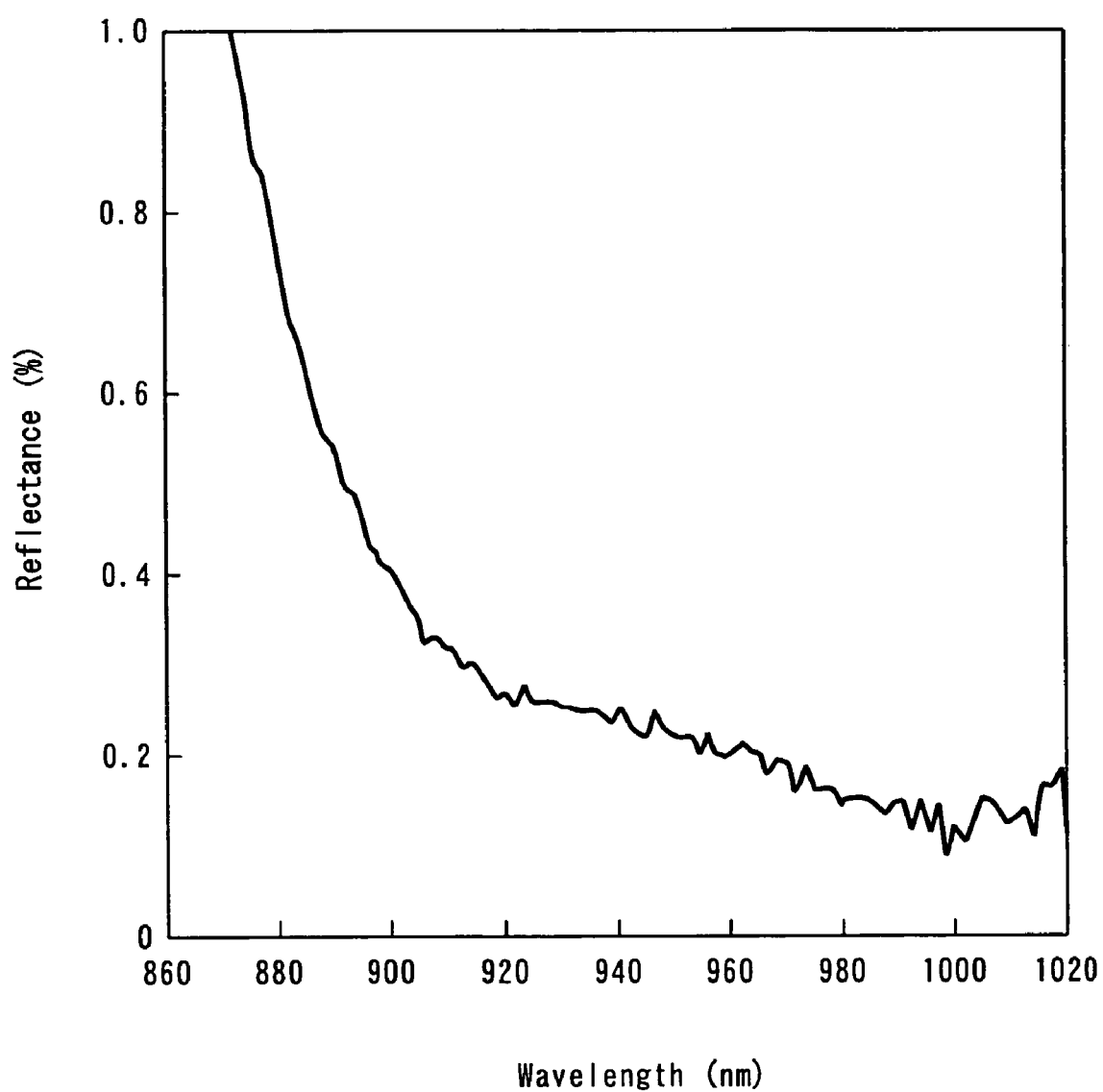
FIG. 6 shows wavelength dependence of the reflectance of the low-reflective film according to the present invention.

FIG. 6 shows a relationship between the wavelength and the (front end face) reflectance of a semiconductor laser device of the present embodiment, obtained by measurements. In the example of FIG. 6, the reflectance Rf at the wavelength 984 nm, at which the gain is maximized, is 0.16%. In this case, the change in the mirror loss per unit wavelength (Δα/Δλ) obtained based on the mirror loss values in the wavelength range 984 nm±10 nm is 0.015 $cm^{-1}$/nm.

Figure 7:
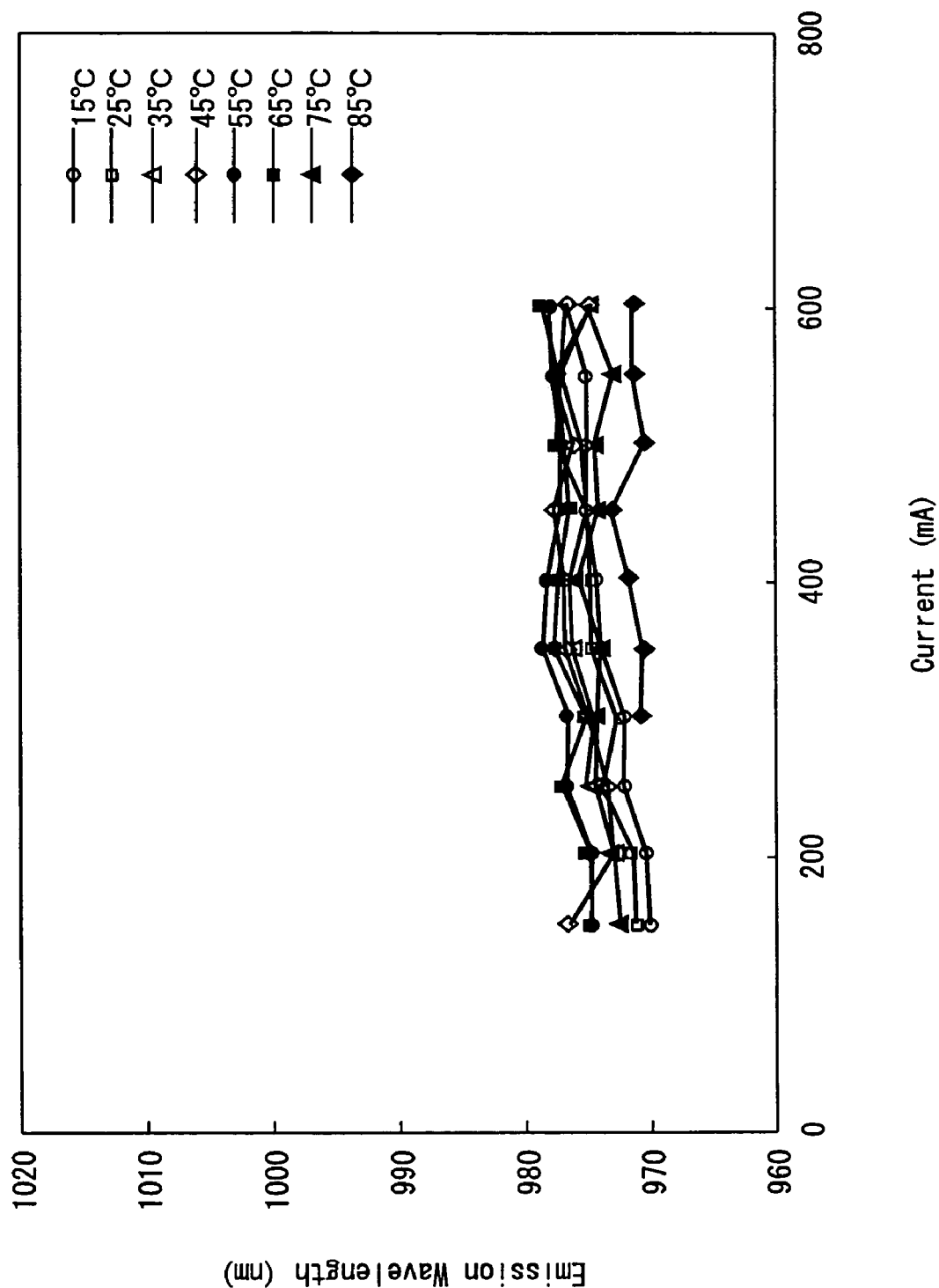
FIG. 7 shows relationships between the injection current and the emission wavelength of the semiconductor laser device according to the present invention at different temperature.

FIG. 7 shows relationships between the injection current and the emission wavelength of the semiconductor laser device shown in FIG. 6 at different temperatures, obtained by measurements. The emission wavelength of the semiconductor laser device tends to gradually increase with increasing injection current and temperature. According to the present embodiment, however, when the temperature and the injection current change from 15° C. and 100 mA to 85° C. and 600 mA, respectively, the change in the emission wavelength ΔλL is very small (approximately 8.19 nm). Thus, when a film whose reflectance changes with wavelength is provided on the front end face of a semiconductor laser device, the range of the change in the emission wavelength with change in the injection current and temperature can be limited to a small range. When, on the other hand, a film whose reflectance does not change with wavelength is provided on the front end face of a semiconductor laser device, the emission wavelength considerably changes. For example, experiment showed that when the temperature and the injection current changed from 15° C. and 100 mA to 85° C. and 600 mA, respectively, the change in the emission wavelength ΔλL was as large as 40 nm.

Figure 8:
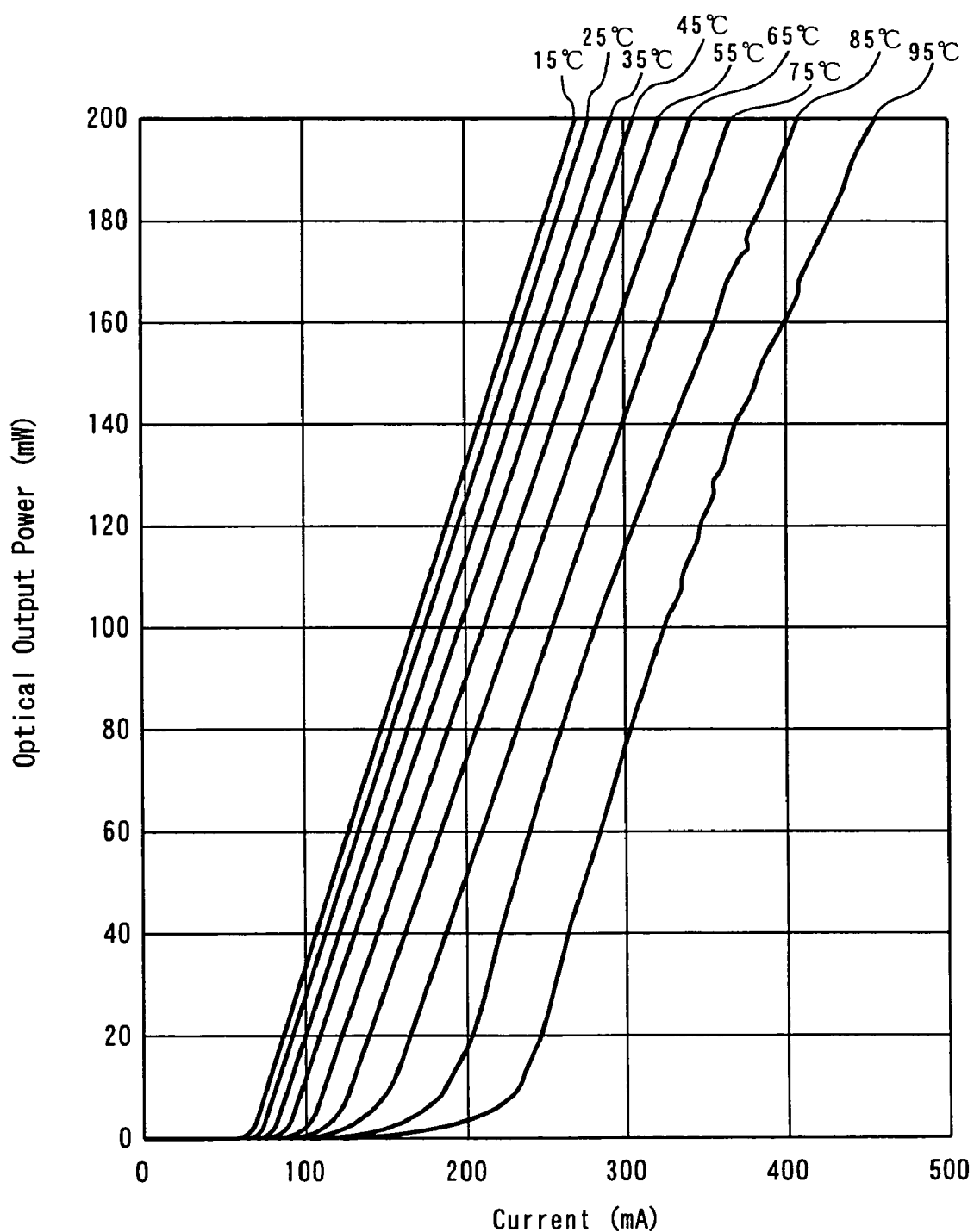
FIG. 8 shows relationships between the injection current and the optical output power of the semiconductor laser device according to the present invention at different temperature.

FIG. 8 shows relationships between the current and the optical output power of the semiconductor laser device shown in FIG. 6 at different temperatures, obtained by measurements. As can be seen from the figure, the threshold current increases with temperature but the efficiency changes little.

Generally, the lower the reflectance, the larger the optical output power which can be drawn from the semiconductor laser device and hence the higher the slope efficient. According to the present invention, however, since the film provided on the front end face of the semiconductor laser device has a low reflectance level (1% or less), carrier overflow occurs due to band filling effect. Therefore, the internal quantum efficiency decreases, canceling the increase in the mirror loss. This can reduce the change in the slope efficiency due to a temperature change.

Figure 9:
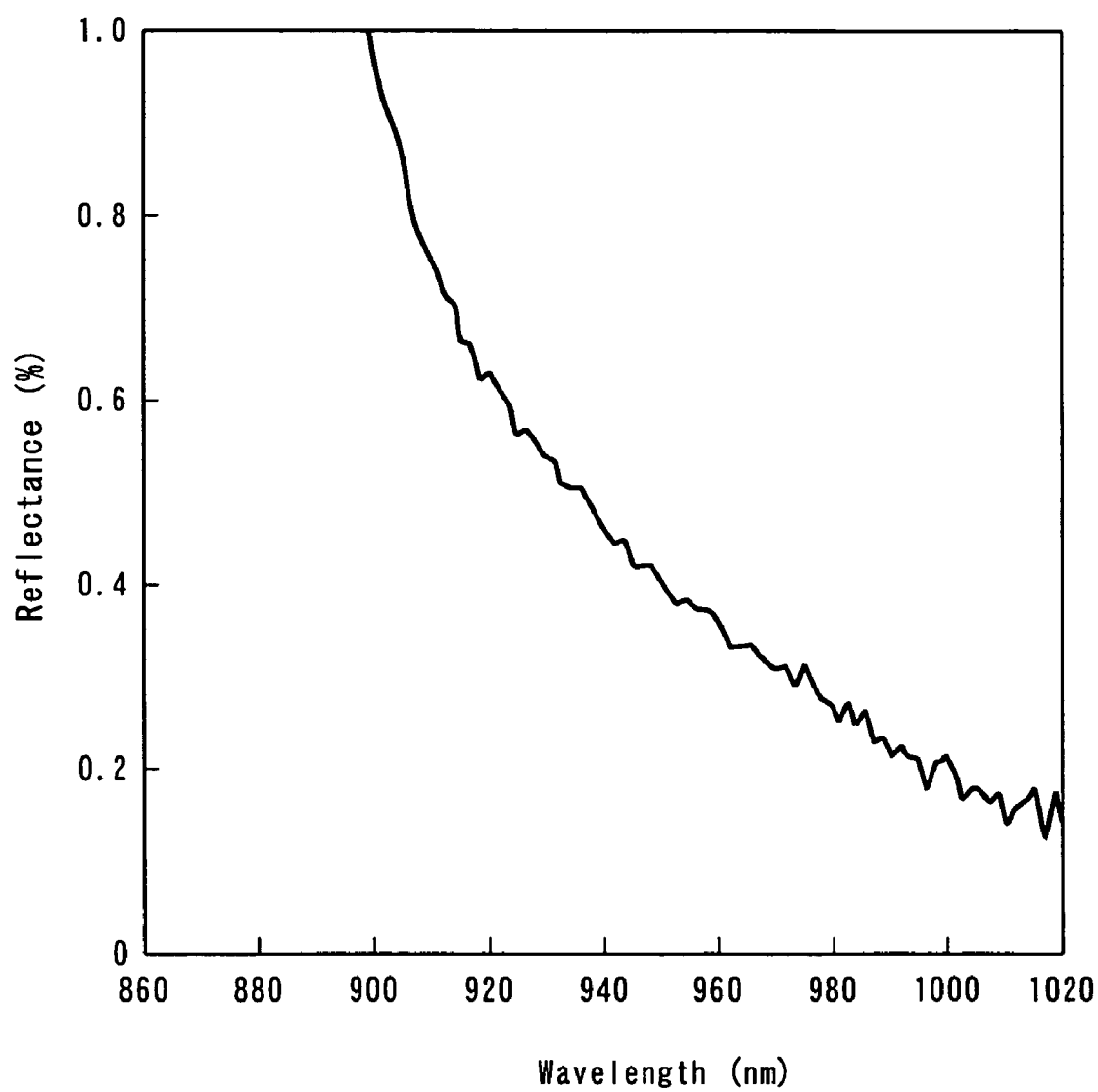
FIG. 9 shows wavelength dependence of the reflectance of the low-reflective film according to the present invention.

The amount of change in the reflectance and in the mirror loss at the wavelength at which the gain is maximized can be varied by changing the wavelength at which no reflection occurs or changing the film thickness of each layer constituting the nonreflective film. FIG. 9 shows a relationship between the wavelength and the (front end face) reflectance of another semiconductor laser device of the present embodiment, obtained by measurements. In the example of FIG. 9, the reflectance Rf at the wavelength 984 nm, at which the gain is maximized, is 0.32%. In this case, the change in the mirror loss per unit wavelength ($\Delta\alpha/\Delta\lambda$) obtained based on the mirror loss values in the wavelength range 984 nm±10 nm is 0.038 cm$^{-1}$/nm.

Figure 10:
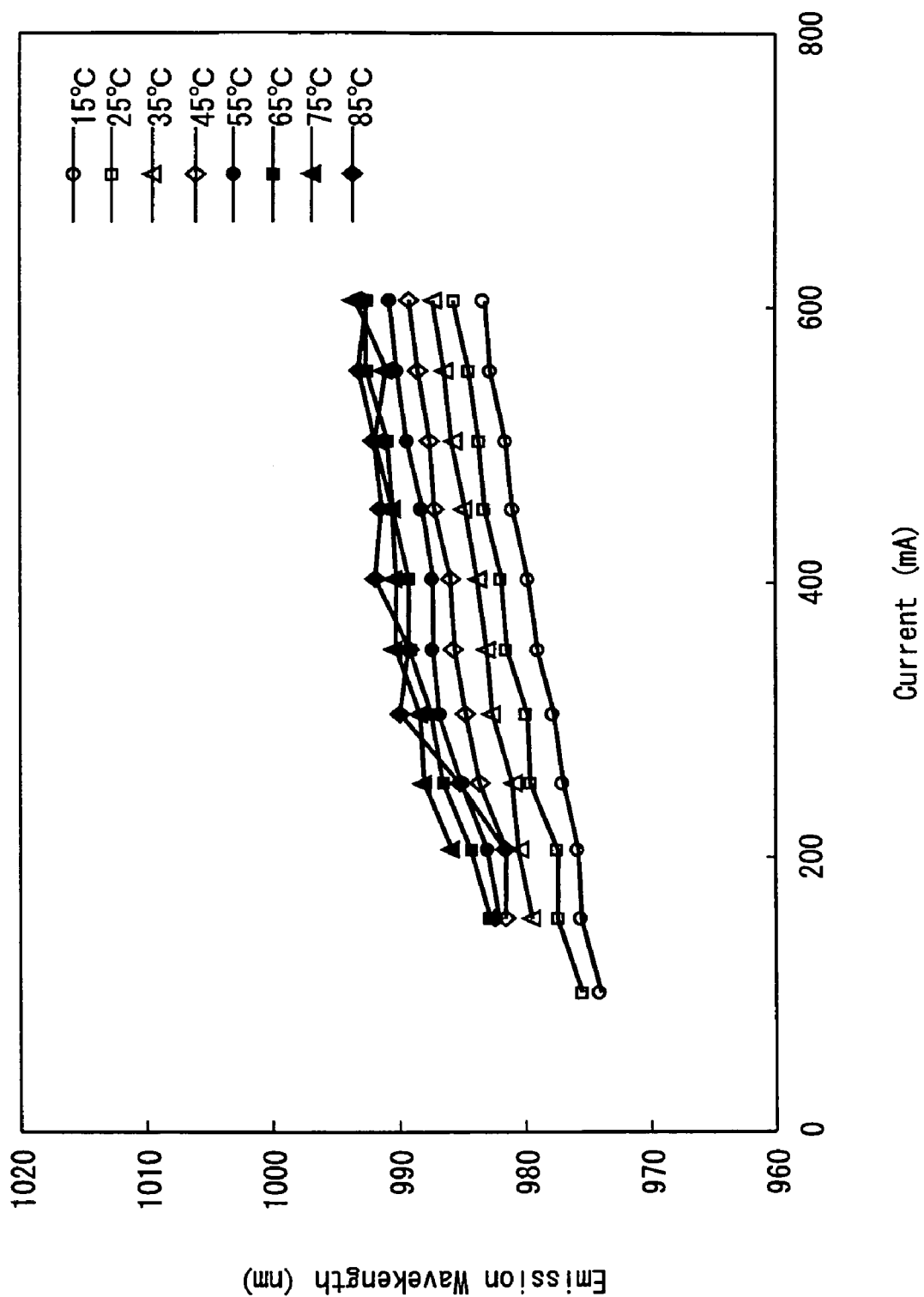
FIG. 10 shows relationships between the injection current and the emission wavelength of the semiconductor laser device according to the present invention at different temperature.

FIG. 10 shows relationships between the injection current and the emission wavelength of the semiconductor laser device shown in FIG. 9 at different temperatures, obtained by measurements. The emission wavelength of the semiconductor laser device gradually increases with increasing injection current and temperature, as in FIG. 7. In this case, when the temperature and the injection current change from 15° C. and 100 mA to 85° C. and 600 mA, respectively, the change in the emission wavelength $\Delta\lambda L$ is approximately 19.87.

Figure 11:
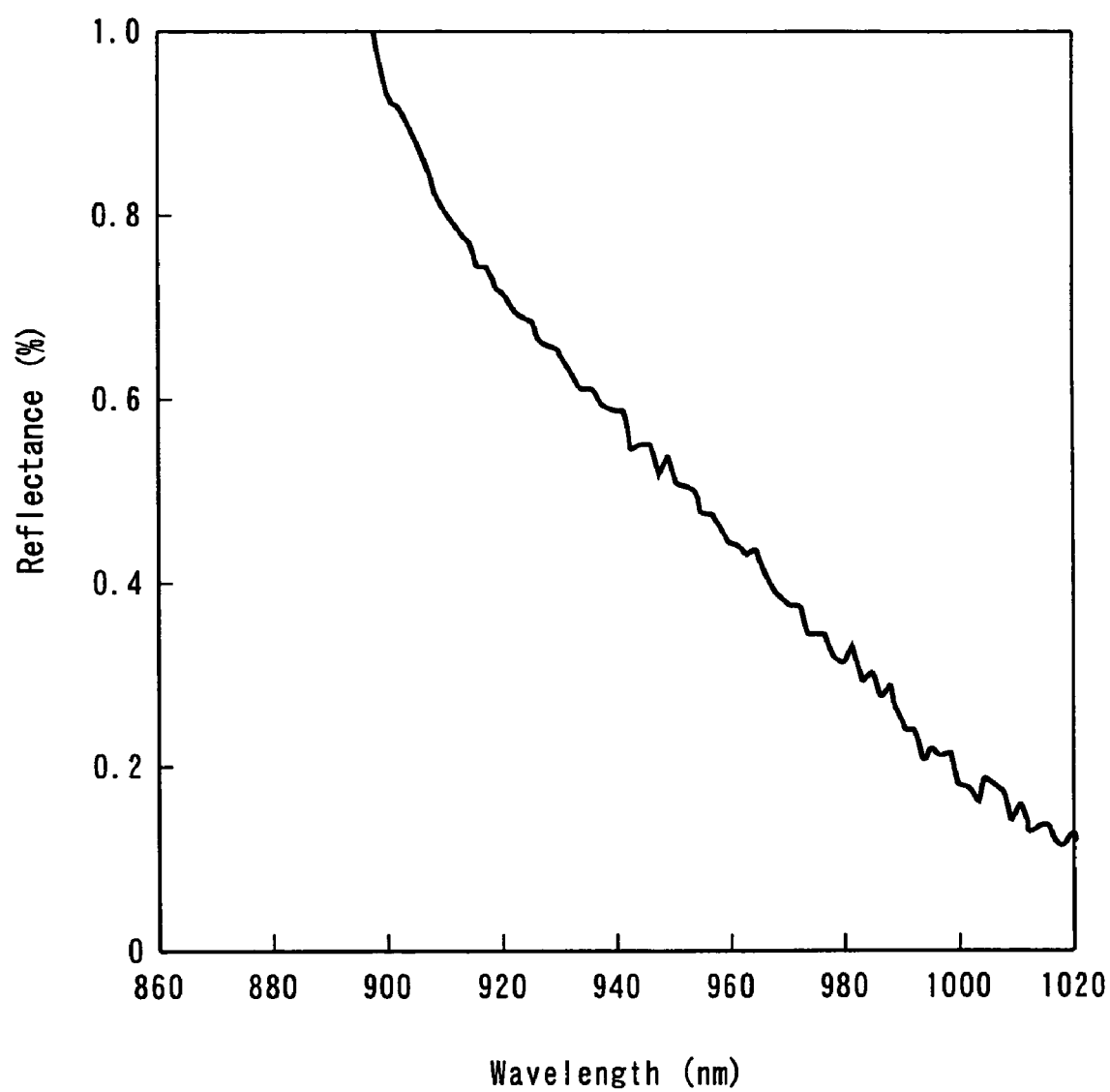
FIG. 11 shows wavelength dependence of the reflectance of the low-reflective film according to the present invention.

FIG. 11 shows a relationship between the wavelength and the (front end face) reflectance of still another semiconductor laser device of the present embodiment, obtained by measurements. In the example of FIG. 11, the reflectance Rf at the wavelength 984 nm, at which the gain is maximized, is 0.25%. In this case, the change in the mirror loss per unit wavelength ($\Delta\alpha/\Delta\lambda$) obtained based on the mirror loss values in the wavelength range 984 nm±10 nm is 0.063 cm$^{-1}$/nm.

Figure 12:
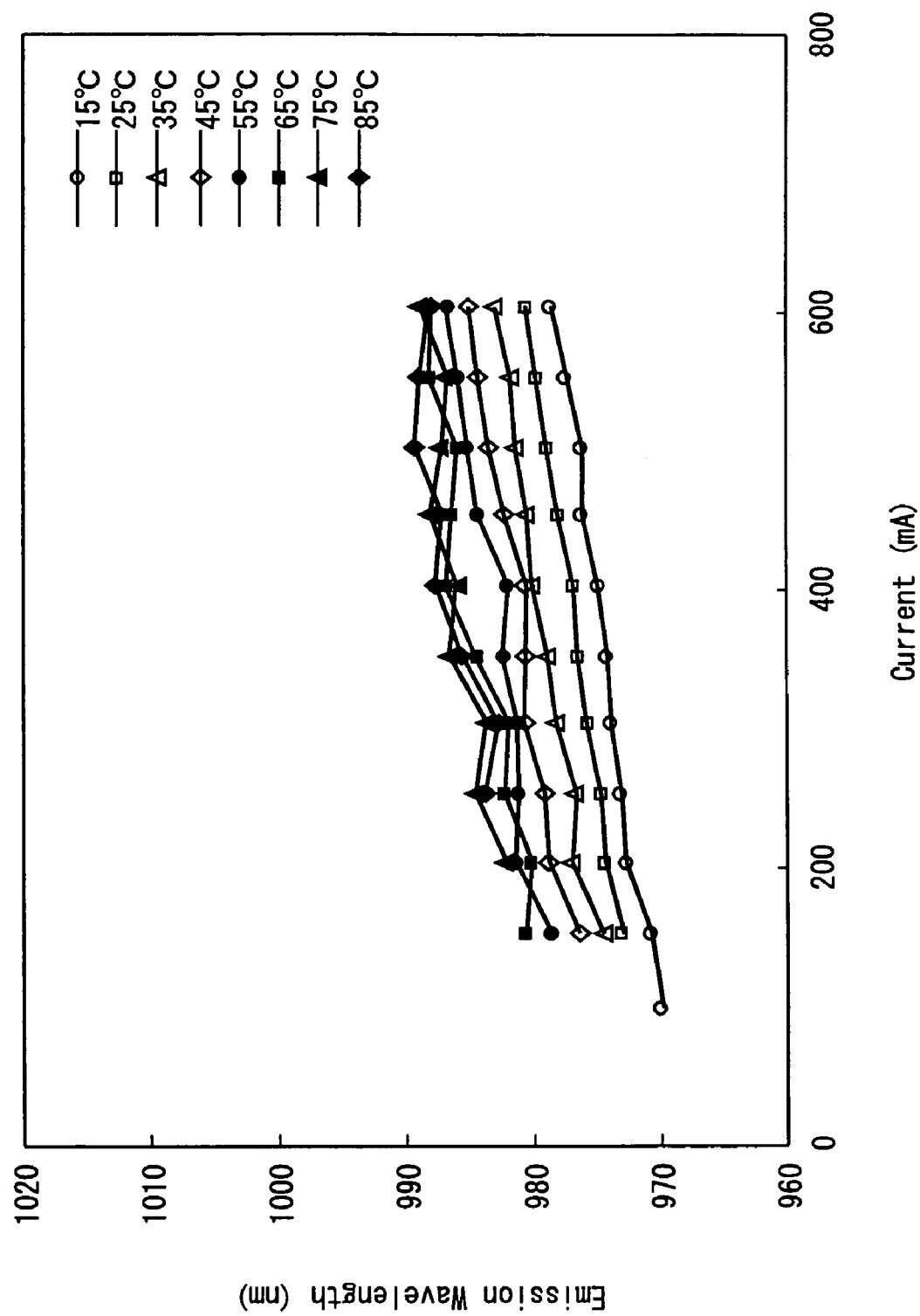
FIG. 12 shows relationships between the injection current and the emission wavelength of the semiconductor laser device according to the present invention at different temperature.
Figure 13:
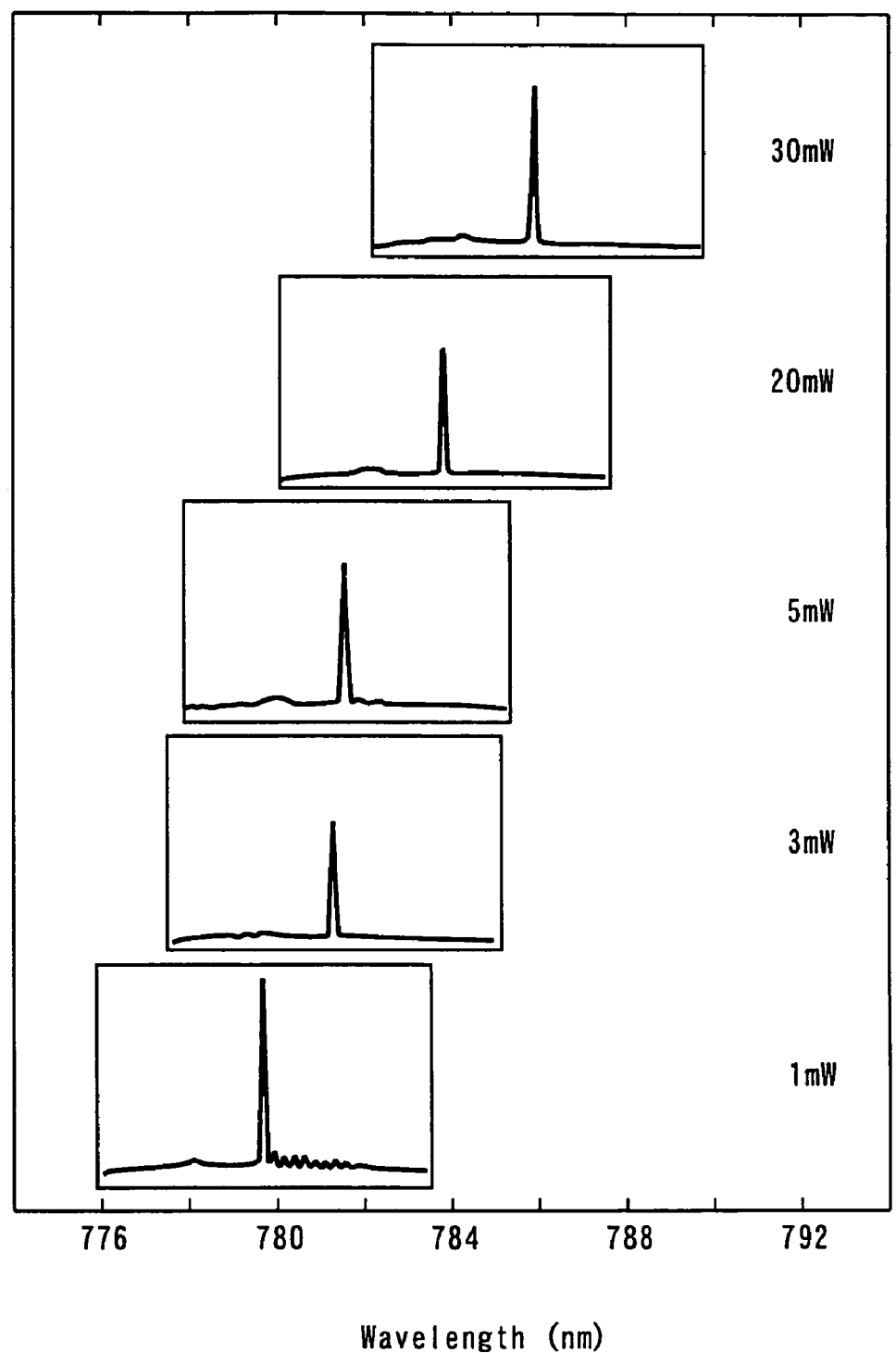
FIG. 13 shows the relationship between the wavelength and the optical output power of a conventional semiconductor laser device.

FIG. 12 shows relationships between the injection current and the emission wavelength of the semiconductor laser device shown in FIG. 11 at different temperatures, obtained by measurements. The emission wavelength of the semiconductor laser device increases with increasing injection current and temperature, as in FIGS. 7 and 10. In this case, when the temperature and the injection current change from 15° C. and 100 mA to 85° C. and 600 mA, respectively, the change in the emission wavelength $\Delta\lambda L$ is approximately 18.53 nm.

According to the present embodiment, the nonreflective (low-reflective) film provided on the front end face of a semiconductor laser device is a multilayer film made up of 6 layers. However, the present invention is not limited to this particular type of film. Any low-reflective film can be used if its reflectance changes with the wavelength and furthermore the wavelength at which the reflectance is minimized is on the long wavelength side of the wavelength at which the gain of the semiconductor laser device is maximized.

That is, it may be a multilayer film other than a 6-layer film (for example, an 8-layer film), or it may be a single layer film.

Further, the present invention can be applied to semiconductor laser devices other than those for fiber amplifier excitation light sources (their emission wavelength is 980 nm). For example, it can be applied to semiconductor laser devices whose emission wavelength is 780 nm, 1.3 µm, 1.48 µm, or 1.55 µm, in addition to red semiconductor laser devices and blue-violet semiconductor laser devices.

The features and advantages of the present invention may be summarized as follows.

According to one aspect, the semiconductor laser device of the present invention is constructed such that the light emitting end face has provided thereon a low-reflective film whose reflectance changes with the wavelength, wherein the wavelength at which the reflectance of the low-reflective film is minimized is on the long wavelength side of the wavelength at which the gain of the semiconductor laser device is maximized, and wherein the gain and the loss of the semiconductor laser device become equal at a wavelength only in the wavelength region in which the reflectance of the low-reflective film decreases with increasing wavelength. This arrangement can provide a semiconductor laser device having a low-reflectance front end face and exhibiting only a small change in the emission wavelength with temperature.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2003-303368, filed on Aug. 27, 2003 including specification, claims, drawings and summary, on which the Convention priority of the present application is based, are incorporated herein by reference in its entirety.

What is claimed is:

1. A semiconductor laser device comprising: an active layer;
   a cladding layer; and
   an end face for emitting light;
   wherein a low-reflective film is provided on said end face, the reflectance of said low-reflective film changing with wavelength;
   wherein a wavelength at which said reflectance of said low-reflective film is minimized is on a long wavelength side of a wavelength at which a gain of said semiconductor laser device is maximized; and
   wherein said gain and a loss of said semiconductor laser device become equal at a wavelength only in a wavelength region in which said reflectance of said low-reflective film decreases with increasing wavelength.

2. The semiconductor laser device according to claim 1, wherein said reflectance of said low-reflective film is 1% or less at said wavelength at which said gain of said semiconductor laser device is maximized.

3. The semiconductor laser device according to claim 1, wherein said low-reflective film comprises an $Al_2O_3$ film, $SiO_2$ films, and $Ta_2O_5$ films, said $SiO_2$ films and said $Ta_2O_5$ films being laminated alternately on said $Al_2O_3$ film, and said $Al_2O_3$ film is disposed closest to said end face.

4. The semiconductor laser device according to claim 2, wherein said low-reflective film comprises an $Al_2O_3$ film, $SiO_2$ films, and $Ta_2O_5$ films, said $SiO_2$ films and said $Ta_2O_5$ films being laminated alternately on said $Al_2O_3$ film, and said $Al_2O_3$ film is disposed closest to said end face.

5. A laser system, comprising:
   a semiconductor laser having an end face, configured to have a maximum gain corresponding to a wavelength, and configured to have a gain which is reduced from the maximum gain as a wavelength of the optical output increases from the wavelength of the maximum gain; and
   a reflective film provided on the end face, the reflective film configured to decrease in reflectivity throughout a wavelength range beginning at the wavelength corresponding to the maximum gain to an increased wavelength at which the reflective film has a minimum reflectivity,
   the reflective film having an $Al_2O_3$ layer, and two layers at a distance further from the semiconductor laser than the $Al_2O_3$ layer, one of said two layers comprising $SiO_2$ and another of said two layers comprising $Ta_2O_5$.

6. A laser system according to claim 5, wherein the $SiO_2$ layer contacts and is disposed between the $Al_2O_3$ layer and the $Ta_2O_5$ layer.

7. A laser system according to claim 6, wherein the reflective film further comprises:
   a second $SiO_2$ layer contacting the $Ta_2O_5$ layer, and a second $Ta_2O_5$ layer contacting the second $SiO_2$ layer.

8. A laser system according to claim 7, wherein the reflective film further comprises:
   a third $SiO_2$ layer contacting the second $Ta_2O_5$ layer.

9. A laser system, comprising:
   a semiconductor laser having an end face, configured to have a maximum gain corresponding to a wavelength, and configured to have a gain which is reduced from the maximum gain as a wavelength of the optical output increases from the wavelength of the maximum gain; and
   a reflective film provided on the end face, the reflective film configured to decrease in reflectivity throughout a wavelength range beginning at the wavelength corresponding to the maximum gain to an increased wavelength at which the reflective film has a minimum reflectivity, wherein a gain of the semiconductor laser and a mirror loss are equal only in said wavelength range.

10. A laser system according to claim 9, wherein the reflective film compnses:
   an $Al_2O_3$ layer, and two layers at a distance further from the semiconductor laser than the $Al_2O_3$ layer, one of said two layers comprising $SiO_2$ and another of said two layers comprising $Ta_2O_5$.

11. A laser system according to claim 10, wherein the $SiO_2$ layer contacts and is disposed between the $Al_2O_3$ layer and the $Ta_2O_5$ layer.

12. A laser system according to claim 11, wherein the reflective film further comprises:
   a second $SiO_2$ layer contacting the $Ta_2O_5$ layer, and a second $Ta_2O_5$ layer contacting the second $SiO_2$ layer.

13. A laser system according to claim 12, wherein the reflective film further comprises:
   a third $SiO_2$ layer contacting the second $Ta_2O_5$ layer.

14. A semiconductor laser device comprising:
   an active layer;
   a cladding layer; and
   an end face for emitting light;
   wherein a low-reflective film is provided on said end face, the reflectance of said low-reflective film changing with wavelength;
   wherein a wavelength at which said reflectance of said low-reflective film is minimized is on a long wavelength side of a wavelength at which a gain of said semiconductor laser device is maximized; and
   wherein said gain and a loss of said semiconductor laser device become equal at a wavelength in a wavelength region in which said reflectance of said low-reflective film decreases with increasing wavelength and when a temperature of the semiconductor laser device is in a range of 15° C. and 85° C.

15. A semiconductor laser device comprising:
   an active layer;
   a cladding layer; and
   an end face for emitting light;
   wherein a low-reflective film is provided on said end face, the reflectance of said low-reflective film changing with wavelength;
   wherein a wavelength at which said reflectance of said low-reflective film is minimized is on a long wavelength side of a wavelength at which a gain of said semiconductor laser device is maximized;
   wherein said gain and a loss of said semiconductor laser device become equal at a wavelength in a wavelength region in which said reflectance of said low-reflective film decreases with increasing wavelength; and
   wherein said reflectance of said low-reflective film is 1% or less at said wavelength at which said gain of said semiconductor laser device is maximized.

* * * * *